(12) United States Patent
Yamaoka (10) Patent No.: US 7,545,696 B2
(45) Date of Patent: Jun. 9, 2009

(54) FERRO-ELECTRIC MEMORY DEVICE (75) Inventor: Kunisato Yamaoka, Takatsuki (JP)

(73) Assignee: Panasonic Corporation, Osaka (JP)

( * ) Notice: Subject to any disclaimer, the term of this patent is extended or adjusted under 35 U.S.C. 154(b) by 196 days.

(21) Appl. No.: 11/320,827

(22) Filed: Dec. 30, 2005

(65) Prior Publication Data
US 2006/0171186 A1 Aug. 3, 2006

(30) Foreign Application Priority Data
Jan. 28, 2005 (JP) ............... 2005-021437

(51) Int. Cl.
G11C 7/04 (2006.01)
(52) U.S. Cl. ............... 365/211; 365/145; 365/148
(58) Field of Classification Search ........... 365/211, 365/145, 146, 147
See application file for complete search history.

(56) References Cited

U.S. PATENT DOCUMENTS

| 6,114,861 | A | * | 9/2000 | Takeo | 324/658 |
| 6,191,971 | B1 | | 2/2001 | Tanaka et al. | |
| 6,272,037 | B1 | | 8/2001 | Miyamoto | |
| 7,046,541 | B2 | * | 5/2006 | Ogiwara et al. | 365/145 |
| 7,139,186 | B2 | * | 11/2006 | Shiraishi | 365/145 |
| 2003/0081484 | A1 | * | 5/2003 | Kobayashi et al. | 365/222 |
| 2003/0227792 | A1 | * | 12/2003 | Marr | 365/154 |
| 2005/0073869 | A1 | * | 4/2005 | Gudesen et al. | 365/145 |
| 2005/0122765 | A1 | * | 6/2005 | Allen et al. | 365/145 |

FOREIGN PATENT DOCUMENTS

JP 2003-59251 2/2003

OTHER PUBLICATIONS

English language Abstract of JP 2003-59251.

* cited by examiner

Primary Examiner—Van Thu Nguyen
Assistant Examiner—Han Yang
(74) Attorney, Agent, or Firm—Greenblum & Bernstein, P.L.C.

(57) ABSTRACT

A ferro-electric memory device suppresses deterioration of retention characteristics at the time when an ambient temperature has decreased, without requiring a much longer cycle time. The ferro-electric memory device includes a first ferro-electric capacitor for use in a first normal cell and a second ferro-electric capacitor for use in a second normal cell. The ferro-electric memory device also includes: a temperature detection circuit which detects an ambient temperature of the first and second normal cells; and a normal cell power supply switching circuit which switches a voltage to be applied to the first and second ferro-electric capacitors depending on the detected temperature.

2 Claims, 6 Drawing Sheets

FERRO-ELECTRIC MEMORY DEVICE

BACKGROUND OF THE INVENTION (1) Field of the Invention

The present invention relates to a ferro-electric memory device having ferro-electric capacitors, and in particular to a ferro electric memory device with an improved retention characteristic.

(2) Description of the Related Art

In recent years, with the refinement and increase in capacity of the memory cells which constitute a ferro-electric memory device, the sizes of the memory cells in the ferro-electric memory device have become small. As the result, the sizes of ferro-electric capacitors have also been decreased, and thus the electric charge amounts have also been decreased. After that, the following is becoming important: how to secure sufficient amounts of electric charges to be read out and to increase the electric potential difference to be amplified by a sense amplifier, that is, the difference in electric potentials to be read out from the ferro-electric capacitors.

Here, the configuration of a ferro-electric memory device in a conventional embodiment will be described with reference to figures (for example, refer to Reference 1: Japanese Laid-Open Patent Application No. 2003-59251).

Figure 1:
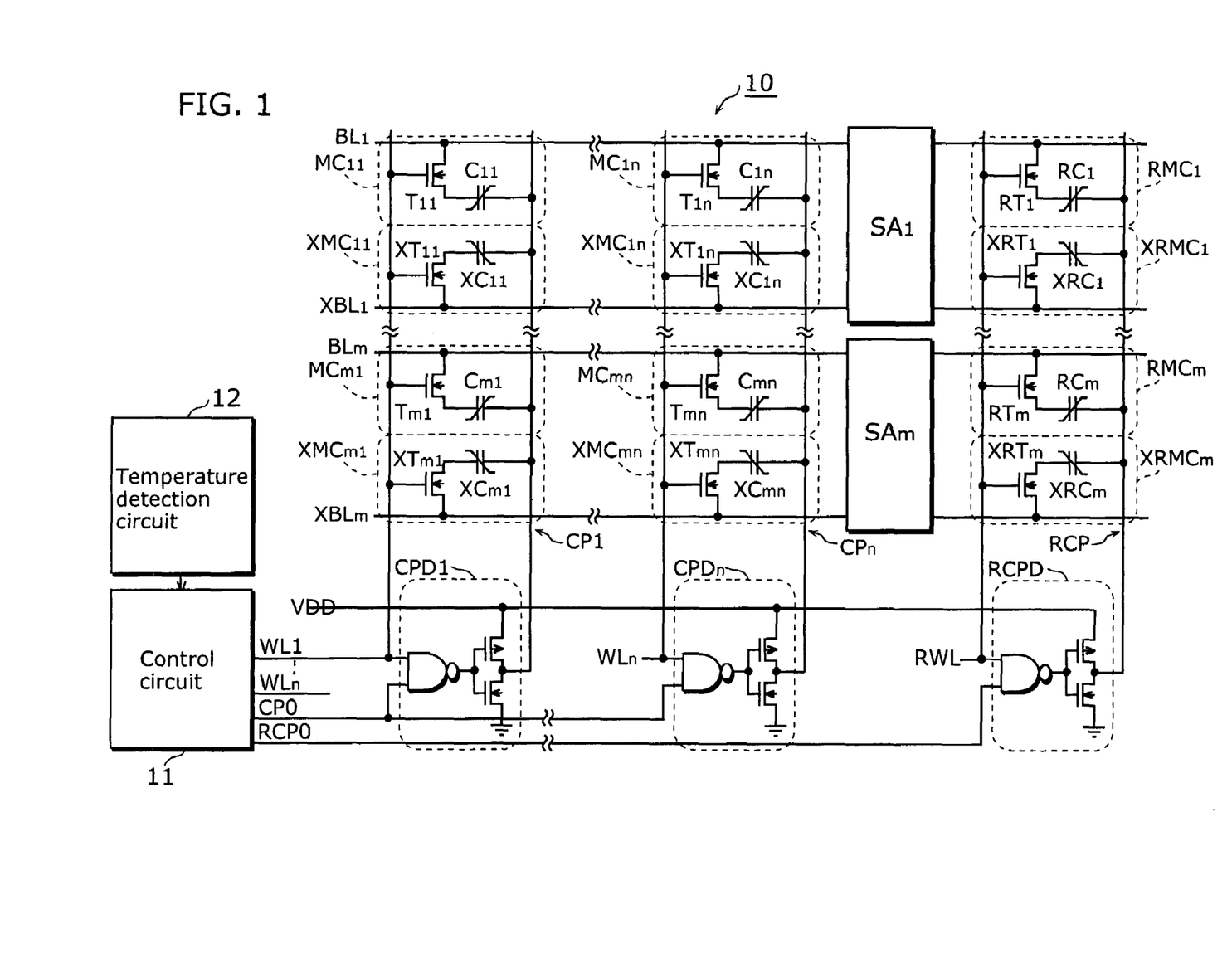
FIG. 1 is a diagram showing the circuit configuration of the ferro-electric memory device in a conventional embodiment.

As shown in FIG. 1, the ferro-electric memory device 10 has 2T2C type memory cells which are arranged in an m×n array. More specifically, the ferro-electric memory device 10 includes: normal cells MC11 to MCmn; normal cells XMC11 to XMCmn; normal cell plate drivers CPD1 to CPDn; reference cells RMC1 to RMCm; reference cells XRMC1 to XRMCm; a reference cell plate driver RCPD; sense amplifiers SA1 to SAm; a power supply VDD; a control circuit 11; a temperature detection circuit 12 and the like.

Hereinafter, the suffix "i" represents an integer of 1 to m, and the suffix "1-m" represents all the integers of 1 to m. Likewise, the suffix "j" represents an integer of 1 to n, and the suffix "1-n" represents all the integers of 1 to n.

Note that 2T2C type memory cells are made up of a pair of 1T1C type memory cells in which complementary data is written. Here is an example case where data is written in the memory cell which is made up of a normal cell MCmn and a normal cell XMCmn. When data "1" is written in the normal cell MCmn through a bit line BLm, data "0" is written in the XMCmn through a bit line XBLm. After that, in the case where the data is read out, the difference between the potential corresponding to the data "1" and the potential corresponding to the data "0" which are read out through the bit line BLm and the bit line XBLm is amplified by the sense amplifier SAm.

The respective normal cell MC[i][j] and normal cell XMC[i][j] are 1T1C type memory cells.

The normal cell MC[i][j] includes a normal cell transistor T[i][j] and a normal cell ferro-electric capacitor C[i][j]. Likewise, the normal cell XMC[i][j] includes a normal cell transistor XT[i][j] and a normal cell ferro-electric capacitor XC[i][j].

The normal cell plate driver CPD[J] supplies a voltage to be applied to the ferro-electric capacitors C[1-m][j] and XC[1-m][j] which are connected to the normal cell plate line CP[j] using the voltage to be supplied from the power supply VDD which is a source.

The respective reference cells RMC[i] and XRMC[i] are 1T1C type memory cells.

The reference cell RMC[i] includes a reference cell transistor RT[i] and a reference cell ferro-electric capacitor RC[i]. Likewise, the reference cell XRMC[i] includes a reference cell transistor XRT[i] and a reference cell ferro-electric capacitor XRC[i].

The reference cell plate driver RCPD supplies a voltage to be applied to the reference cell ferro-electric capacitors RC[i] and XRC[i] which are connected to the reference cell plate line RCP using the voltage to be supplied from the power supply VDD which is a source.

The sense amplifier SA[i] amplifies the difference in the potential corresponding to the data which has been read out through the bit line BL[i] and the potential corresponding to the data which has been read out through the bit line XBL[i].

The power supply VDD supplies the voltage vdd to the normal cell plate drivers CPD[1-n] and the reference cell plate driver RCPD.

The control circuit 11 controls the respective normal cell plate drivers CPD[1-n] and a reference cell plate driver RCPD, and drives the respective normal cell plate lines CP[1-n] and the reference cell plate line RCP.

More specifically, the control circuit 11 is connected to (a) the respective normal cell plate driver CPD[j], normal cells MC[1-m][j] and normal cells XMC[1-m][j] through a normal cell word line WL[j]. In addition, the control circuit 11 is connected to (b) the respective normal cell plate drivers CPD[1-n] through the normal cell plate line CP0. In addition, the control circuit 11 is connected to (c) the respective reference cell plate driver RCPD, reference cells RMC[1-m] and reference cells XRMC[1-m] through the reference cell word line RWL. Further, the control circuit 11 is connected to (d) the reference cell plate driver RCPD through the reference cell plate line RCP0.

After that, the control circuit 11 supplies a Hi signal to the respective normal cell plate drivers CPD[1-n] through the normal cell plate line CP0 in the case of driving the normal cell plate line CP[j]. In addition, the control circuit 11 supplies a Hi signal to the normal cell plate driver CPD[j] through the normal cell word line WL[j]. On the other hand, the control circuit 11 supplies a Hi signal to the reference cell plate driver RCPD through the reference cell plate line RCP0 in the case of driving the reference cell plate line RCP. In addition, the control circuit 11 supplies a Hi signal to the reference cell plate driver RCPD through the reference cell word line RWL.

The temperature detection circuit 12 detects a temperature and supplies, to the control circuit 11, a control signal S for switching the time for supplying the Hi signal from a first duration to a second duration which is longer than the first duration when the detected temperature is below a predetermined temperature or below.

However, the ferro-electric memory device in the conventional embodiment lengthens the duration of voltage application to the ferro-electric capacitors in order to suppress the deterioration of the retention characteristics when an ambient temperature has decreased. As the result, there emerges a problem that a much longer cycle time is required.

SUMMARY OF THE INVENTION

The present invention has been conceived considering the above-described problem. An object of the present invention is to provide a ferro-electric memory device which suppresses the deterioration of the retention characteristics at the time when the ambient temperature has decreased, without requiring much longer cycle time.

In order to achieve the above-described object, the ferro-electric memory device concerning the present invention includes: (a) a ferro-electric capacitor in a memory cell; (b) a detection unit which detects an ambient temperature of the memory cell; and (c) a switching unit which switches a voltage to be applied to the ferro-electric capacitor depending on the detected ambient temperature.

In this way, when a temperature decrease has been detected, the voltage to the memory cells can be switched from the first voltage to the second voltage. In addition, it is possible to mitigate the characteristic of difficulty in rewriting of the ferro-electric capacitor at the time of temperature decrease, by switching to a higher voltage and applying the higher voltage.

Further, in a first aspect of the present invention, the switching unit in the ferro-electric memory device may switch the voltage to be applied to the ferro-electric capacitor from a first voltage to a second voltage which is higher than the first voltage, in the case where the ambient temperature has decreased to a predetermined temperature or below.

In this way, the supply of the second voltage which is higher than the first voltage makes it possible to suppress the deterioration of the retention characteristics at the time when an ambient temperature has decreased, without increasing the cycle time.

Further, the first voltage and the second voltage may have pulse waveforms. In addition, in a second aspect of the present invention, the ferro-electric memory device may further include: a control unit which controls a duration of voltage application so that the second voltage is applied for a shorter length of time than the first voltage, in the case where the second voltage is applied.

In this way, it becomes possible to shorten the duration of voltage application to the ferro-electric capacitor included in the memory cell, reduce the application stress to the ferro-electric capacitor included in the memory cell, and suppress the deterioration of the endurance characteristic.

In addition, in the first aspect of the present invention, (a) the ferro-electric memory device may further include: a reference cell which includes a ferro-electric capacitor intended for use in a reference cell and is connected to the memory cell. Further, (b) the switching unit in the device may switch from a first voltage to a second voltage which is higher than the first voltage, in the case where the ambient temperature has decreased to a predetermined temperature. Here, the second voltage may be applied to the respective ferro-electric capacitor included in the memory cell and ferro-electric capacitor included in the reference cell.

In this way, it is possible to secure a sufficient amount of electric charges to be read out and increase the potential difference to be amplified by the sense amplifier, that is, the potential difference to be read out from the ferro-electric capacitor. In addition, the supply of the second voltage which is higher than the first voltage makes it possible to suppress the deterioration of the retention characteristic at the time when an ambient temperature has decreased, without increasing the cycle time.

Further, the first voltage and the second voltage may have pulse waveforms. In addition, in a fourth aspect of the present invention, the ferro-electric memory device may further include: a control unit which controls a duration of voltage application so that the second voltage is applied for a shorter length of time than the first voltage, in the case where the second voltage is applied.

In this way, it is possible to shorten the duration of voltage application to the ferro-electric capacitor intended for use in a reference cell, reduce the application stress to the ferro-electric capacitor in a reference cell which has been accessed more frequently than a memory cell, and suppress the deterioration of the endurance characteristic.

As described above, the ferro-electric memory device of the present invention can suppress the deterioration of the retention characteristic by increasing the voltage to be applied to the ferro-electric capacitor at the time when an ambient temperature has decreased.

FURTHER INFORMATION ABOUT TECHNICAL BACKGROUND TO THIS APPLICATION

The disclosure of Japanese Patent Application No. 2005-021437 filed on Jan. 28th, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Embodiment

Am embodiment of the present invention will be described below with reference to figures.

The ferro-electric memory device in the embodiment concerning the present invention has a feature of switching a power supply to a memory cell from the voltage which can be supplied from the first power supply VDD1 to the voltage which can be supplied from the second power supply VDD2, in the case where the internal temperature detection circuit has detected a temperature decrease.

Considering the above point, the ferro-electric memory device in the embodiment will be described.

First, the configuration of the ferro-electric memory device in the embodiment will be described.

Figure 2:
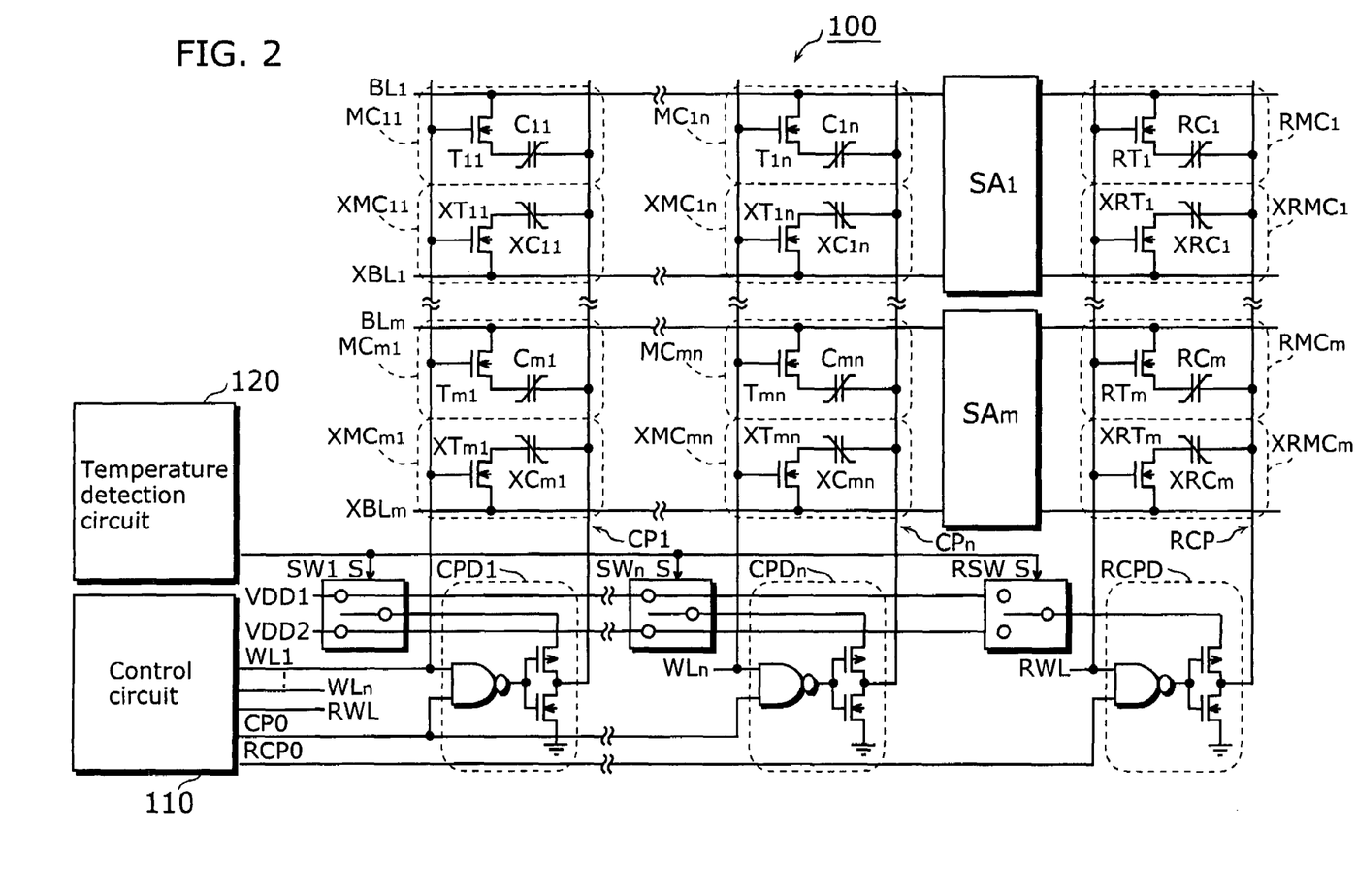
FIG. 2 is a diagram showing the circuit configuration of the ferro-electric memory device in an embodiment concerning the present invention.

As shown in FIG. 2, as an example, the ferro-electric memory device 100 has 2T2C type memory cells which are arranged in a m×n array. More specifically, the ferro-electric memory device 100 includes: normal cells MC11 to MCmn; normal cells XMC11 to XMCmn; normal cell plate drivers CPD1 to CPDn; normal cell power supply switching circuits SW1 to SWn; reference cells RMC1 to RMCm; reference cells XRMC1 to XRMCm; a reference cell plate driver RCPD; a reference cell power supply switching circuit RSW; sense amplifiers SA1 to SAm; a first power supply VDD1; a second power supply VDD2; a control circuit 110; a temperature detection circuit 120 and the like.

Hereinafter, the suffix "i" represents an integer of 1 to m, and the suffix "1-m" represents all the integers of 1 to m.

Likewise, the suffix "j" represents an integer of 1 to n, and the suffix "1-n" represents all the integers of 1 to n.

Note that each 2T2C type memory cell is made up of a pair of 1T1C type memory cells in which complementary data is written. Here is an example case where data is written in the memory cell which is made up of a normal cell MCmn and a normal cell XMCmn. When data "1" is written in the normal cell MCmn through a bit line BLm, data "0" is written in the XMCmn through a bit line XBLm. After that, in the case where the data is read out, the difference between the potential corresponding to the data "1" and the potential corresponding to the data "0" which are read out through the bit line BLm and the bit line XBLm is amplified by the sense amplifier SAm.

The respective normal cell MC[i][j] and normal cell XMC[i][j] are 1T1C type memory cells.

The normal cell MC[i][j] includes a normal cell transistor T[i][j] and a normal cell ferro-electric capacitor C[i][j]. Likewise, the normal cell XMC[i][j] includes a normal cell transistor XT[i][j] and a normal cell ferro-electric capacitor XC[i][j].

The normal cell power supply switching circuit SW[j] selects one of the first power supply VDD1 and the second power supply VDD2 based on the control signal S to be outputted from the temperature detection circuit 120, and supplies the voltage of the selected power supply to the normal cell plate driver CPD[j].

The normal cell plate driver CPD[J] supplies a voltage to be applied to the normal cell ferro-electric capacitors C[1-m][j] and XC[1-m][j] which are connected to the normal cell plate line CP[j] using the voltage to be supplied from the normal cell power supply switching circuit SW[j] which is a source.

The respective reference cells RMC[i] and XRMC[i] are 1T1C type memory cells.

The reference cell RMC[i] includes a reference cell transistor RT[i], a reference cell ferro-electric capacitor RC[i] and the like. Likewise, the reference cell XRMC[i] includes a reference cell transistor XRT[i], a reference cell ferro-electric capacitor RC[i] and the like.

The reference cell power supply switching circuit RSW selects one of the first power supply VDD1 and the second power supply VDD2 based on the control signal S to be outputted from the temperature detection circuit 120, and supplies the voltage of the selected power supply to the reference cell plate driver RCPD.

The reference cell plate driver RCPD supplies a voltage to the reference cell ferro-electric capacitor RC[i] which is connected to the reference cell plate line RCP using the voltage to be supplied from the reference cell power supply switching circuit RSW which is a source.

The sense amplifier SA[i] amplifies the difference between the potential corresponding to the data read out through the bit line BL[i] and the potential corresponding to the data read out through the bit line XBL[i].

The first power supply VDD1 supplies the voltage vdd1 to the normal cell power supply switching circuit SW[j] and the reference cell power supply switching circuit RSW.

The second power supply VDD2 supplies the voltage vdd2 which is higher than the voltage vdd1 to the normal cell power supply switching circuit SW[j] and the reference cell power supply switching circuit RSW.

The control circuit 110 controls the respective normal cell plate drivers CPD[1-n] and a reference cell plate driver RCPD, and drives the respective normal cell plate lines CP[1-n] and the reference cell plate line RCP.

More specifically, the control circuit 110 is connected to the respective (a) normal cell plate driver CPD[j] and normal cells MC[1-m][j], normal cells XMC[1-m][j] through the normal cell word line WL[j]. In addition, the control circuit 110 is connected to (b) the respective normal cell plate drivers CPD[1-n] through the normal cell plate line CP0. Further, the control circuit 110 is connected to (c) the respective reference cell plate driver RCPD, reference cells RMC[1-m] and reference cells XRMC[1-m] through the reference cell word line RWL. Further, the control circuit 110 is connected to (d) the reference cell plate driver RCPD through the reference cell plate line RCP.

After that, the control circuit 110 supplies a Hi signal to the respective normal cell plate drivers CPD[1-n] through the normal cell plate line CP0 in the case of driving the normal cell plate line CP[j]. In addition, the control circuit 110 supplies a Hi signal to the normal cell plate driver CPD[j] through the normal cell word line WL[j]. On the other hand, the control circuit 110 supplies a Hi signal to the respective normal cell plate drivers CPD[1-n] and the reference cell plate driver RCPD through the normal cell plate line CP0. Still further, the control circuit 110 supplies a Hi signal to the reference cell plate driver RCPD through the reference cell word line RWL.

The temperature detection circuit 120 supplies a control signal S for switching a power supply from the first power supply VDD1 to the second power supply VDD2, to the respective normal cell power supply switching circuits SW[1-n] and the reference cell power supply switching circuit RSW, in the case where it has detected a temperature and the temperature has decreased to a predetermined temperature.

Figure 3:
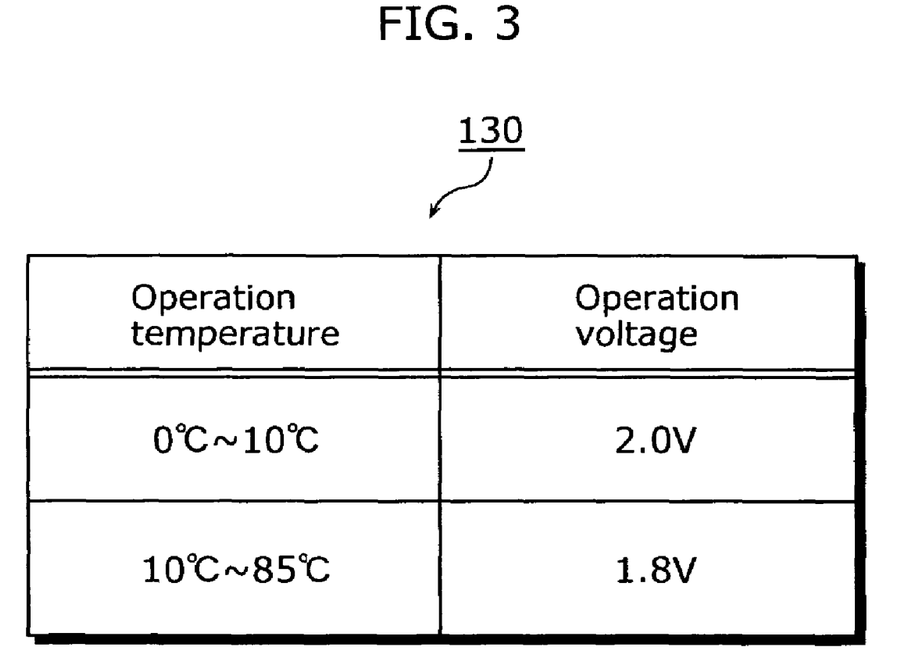
FIG. 3 is a diagram showing a relationship between an operation temperature and a corresponding operation voltage of the ferro-electric memory device in the embodiment concerning the present invention.

As shown in FIG. 3, here is an example where (a) 10 degrees is the operation temperature at which a voltage to be applied is changed and (b) it is assumed that the first power supply VDD1 is 1.8 V and the second power supply VDD2 is 2.0 V. The temperature detection circuit 120 supplies the respective normal cell power supply switching circuits SW[1-n] and the reference cell power supply switching circuit RSW with (a) a control signal S for controlling supply of the first power supply VDD1 in the case where an operation temperature falls within 10 to 85 degrees, or (b) a control signal S for controlling supply of the second power supply VDD2 in the case where an operation temperature falls within 0 to 10 degrees.

Consequently, the operation of the ferro-electric memory device in the embodiment will be described.

Figure 4:
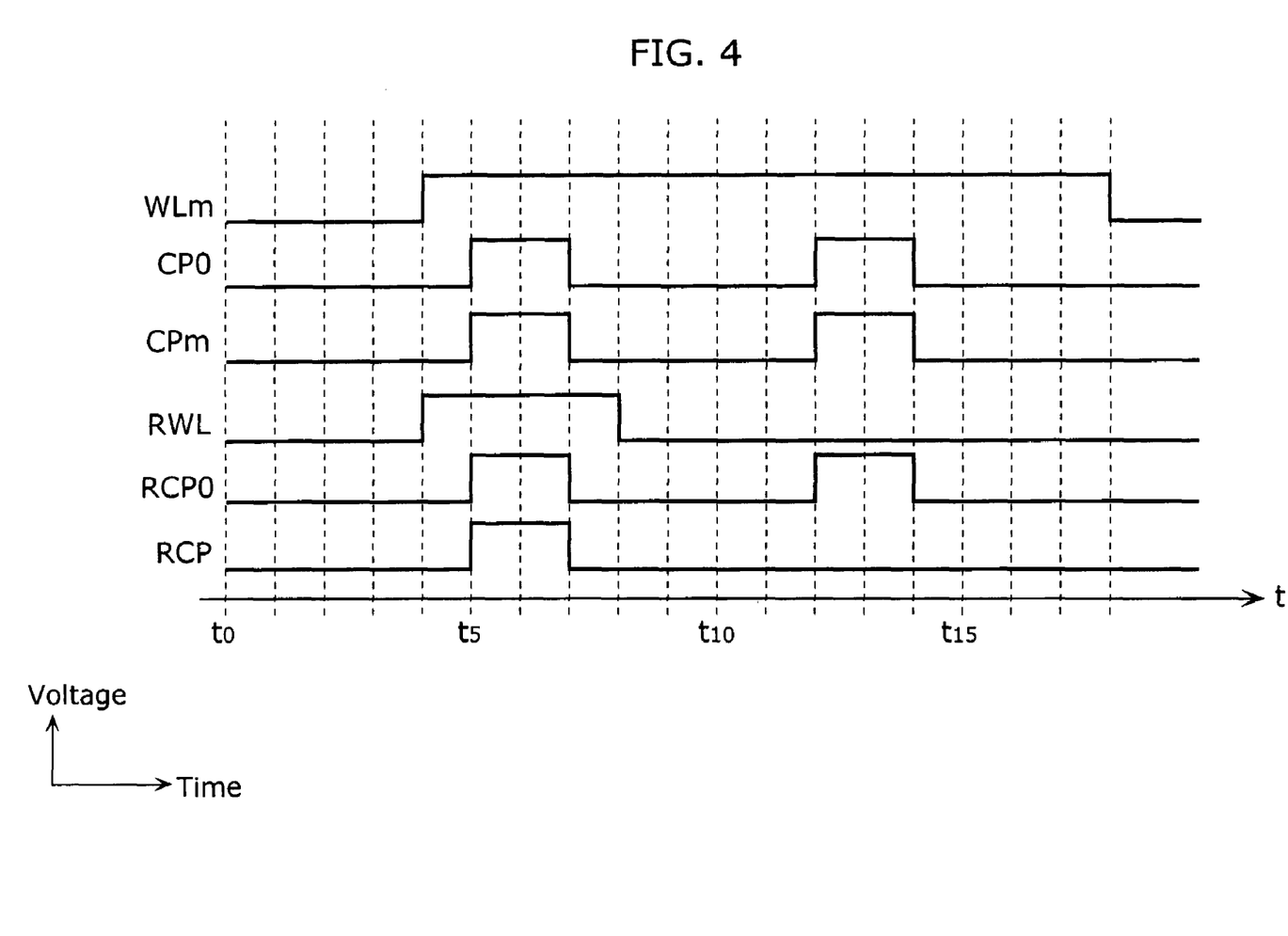
FIG. 4 is a diagram showing the operation of the ferro-electric memory device in the embodiment concerning the present invention.

As shown in FIG. 4, at the time of driving memory cells, the control circuit 110 supplies a Hi signal to the respective normal cells MC[1-m][j] and XMC[1-m][j] through the normal cell word line WL[j] during the time period from t4 to t18. After that, the control circuit 110 applies a voltage to each gate of the transistors included in the normal cells MC[1-m][j] and XMC[1-m][j], that is, normal cell transistors T[1-m][j] and XT[1-m][j], and brings the respective normal cell transistors T[1-m][j] and XT[1-m][j] into conduction. In addition, the control circuit 110 supplies a Hi signal to the normal cell plate driver CPD[j] through the normal cell word line WL[j]. Further, the control circuit 110 supplies a Hi signal to the normal cell plate driver CPD[j] through the cell plate line CP0 during the time periods from t5 to t7 and t12 to t14.

This causes the normal cell plate driver CPD[j] to supply a voltage to the respective normal cell ferro-electric capacitors C[1-m][j] and XC[1-m][j] through the normal cell plate line CP[j] during the time periods from t5 to t7 and t12 to t14.

After that, the control circuit 110 reads out data from the reference cell ferro-electric capacitors C[i][j] and XC[i][j] through the bit lines BL[i] and XBL[i] during the time period from t5 to t7, and amplifies the potential difference of the read-out data using the sense amplifier SA[i].

In addition, the control circuit 110 supplies a Hi signal to the respective reference cells RMC[1-m] and XRMC[1-m] through the reference cell word line RWL during the time period from t4 to t8. After that, the control circuit 110 applies a voltage to each gate of the transistors included in the reference cells RMC[1-m] and XRMC[1-m] the reference cell transistors RT[1-m] and XRT[1-m], and brings the respective reference cell transistors RT[1-m] and XRT[1-m] into conduction. In addition, the control circuit 110 supplies a Hi signal to the reference cell plate driver cells RCPD through the reference cell word line RWL. Further, the control circuit 110 supplies a Hi signal to the reference cell plate driver RCPD through the reference cell plate line RCP0 during the time periods from t5 to t7 and from t12 to t14.

This causes the reference cell plate driver RCPD to supply a voltage to the respective reference cell ferro-electric capacitors RC[1-m] and XRC[1-m] through the reference cell plate line RCP during the time period from t5 to t7.

After that, the control circuit 110 reads out data from the reference cell ferro-electric capacitors RC[i] and XRC[i] through the bit lines BL[i] and XBL[i] during the time period from t5 to t7, and lo amplifies the potential difference of the read-out data using the sense amplifier SA[i].

As described above, the ferro-electric memory device in the embodiment can suppress the deterioration of the retention characteristics at the time of an ambient temperature decrease, without increasing the cycle time by switching power supplies from the second power supply VDD2 for supplying the respective normal cells and reference cells with a voltage which is higher than the voltage supplied by the first power supply VDD1 at the time when the internal temperature detection circuit has detected a temperature decrease.

Others

Note that the control circuit 110 may control the duration of voltage application to the normal cells and reference cells so as to shorten the duration of voltage application in the case where the voltage vdd2 to be supplied from the second power supply VDD2 is applied to the normal cells and reference cells.

Figure 5:
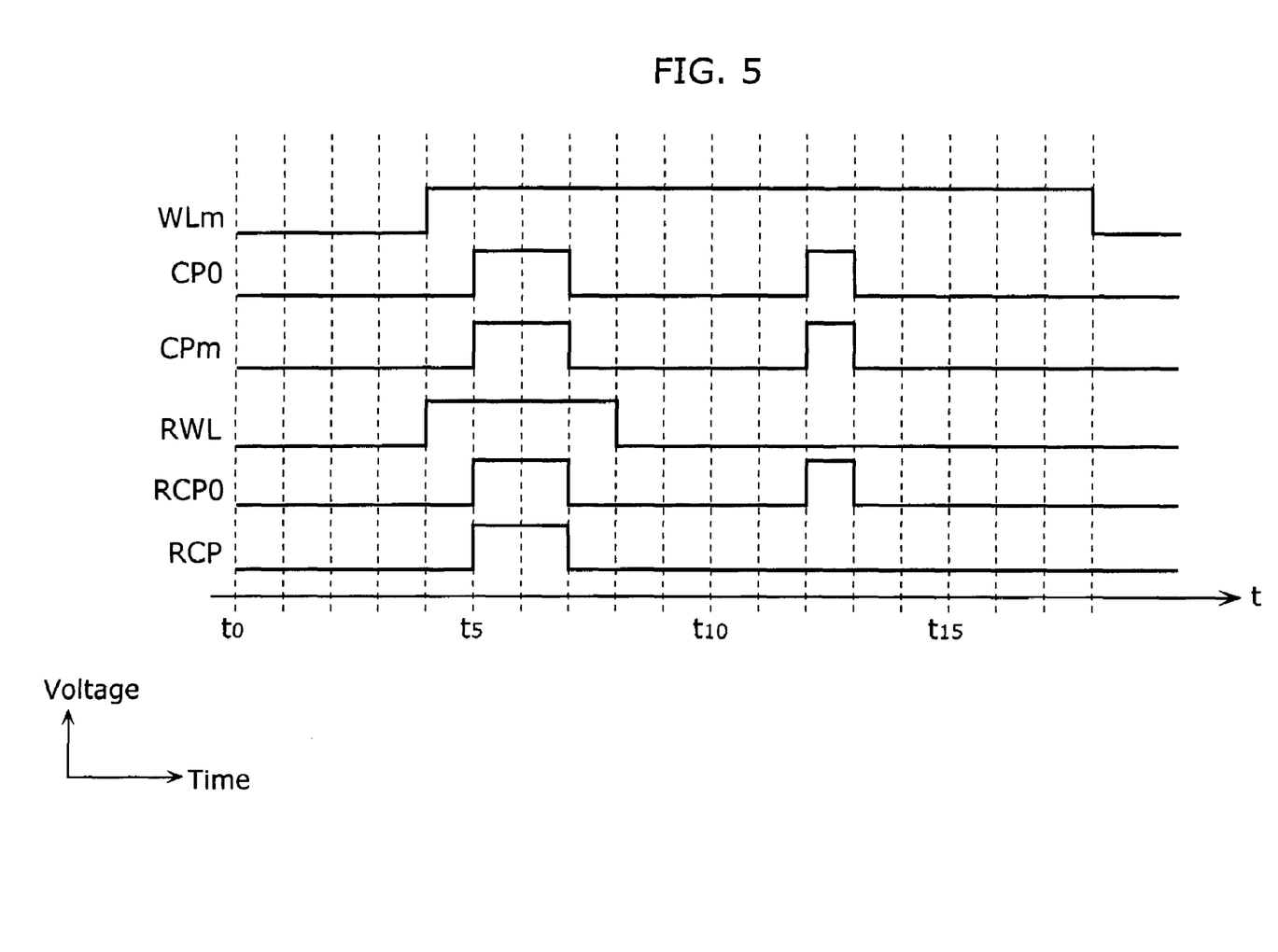
FIG. 5 is a diagram showing the operation of the ferro-electric memory device in Others concerning the present invention.

For example, as shown in FIG. 5, the control circuit 110 supplies a Hi signal to the normal cell plate driver CPD[j] through the cell plate line CP0 during the time period from t12 to t13 instead of the time period from t12 to t14. In addition, the control circuit 110 supplies a Hi signal to the reference cell plate driver RCPD through the reference cell plate line PCP0.

This causes the normal cell plate driver CPD[j] to supply a voltage to the respective normal cell ferro-electric capacitors C[1-m][j] and XC[1-m][j] through the normal cell plate line CP[j] during the time period from t12 to t13.

In this way, the control circuit 110 can reduce the application stress to the respective normal cell ferro-electric capacitor and reference cell ferro-electric capacitor by shortening the duration of voltage application to the respective normal cell ferro-electric capacitor and reference cell ferro-electric capacitor. Thus the control circuit 110 can suppress the deterioration of the endurance characteristics.

Note that the control circuit 110 may control the duration for applying a voltage to the reference cells so as to shorten the application duration in the case of applying the voltage vdd2 which is to be supplied from the second power supply VDD2 to the normal cells and reference cells.

Figure 6:
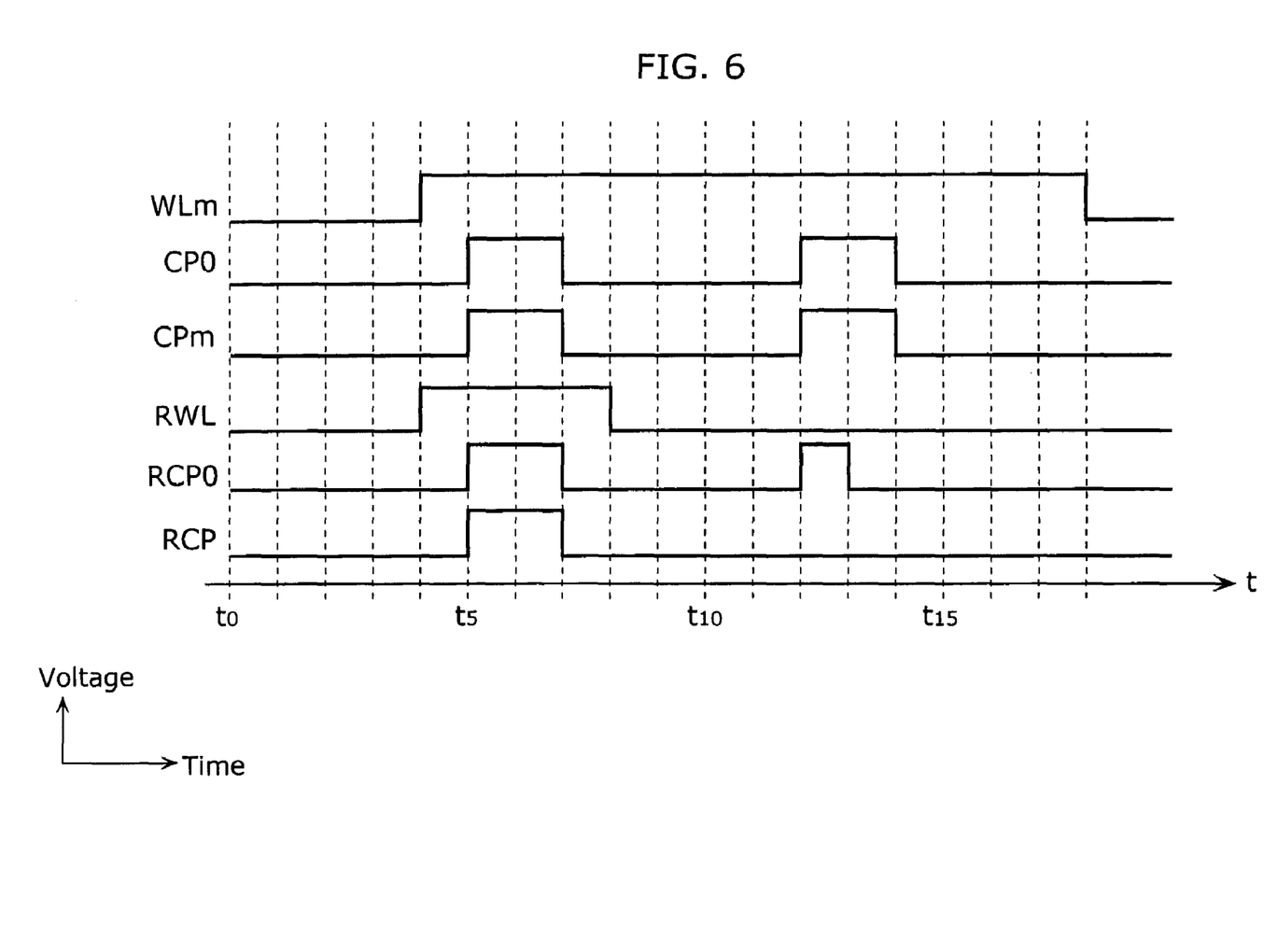
FIG. 6 is a diagram showing the operation of the ferro-electric memory device in Others concerning the present invention.

For example, as shown in FIG. 6, the control circuit 110 supplies a Hi signal to the reference cell plate driver RCPD through the reference cell plate line PCP0 during the time period from t12 to t13 instead of the time period from t12 to t14.

In this way, the control circuit 110 can reduce the application stress to the respective reference cell ferro-electric capacitors included in the reference cells which are accessed more frequently than the normal cells by making the duration of voltage application to the reference cell ferro-electric capacitors shorter than the duration of voltage application to the normal cell ferro-electric capacitors. Thus the control circuit 110 can suppress the deterioration of the endurance characteristics.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention can be used as, for example, a ferro-electric memory device with ferro-electric capacitors, and especially as a ferro-electric memory device to be embedded in an lo apparatus which satisfies the requirements of a low temperature, a low voltage, a high reliability and a high speed.

What is claimed is:

1. A ferro-electric memory device, comprising:
   a memory cell which includes a ferro-electric capacitor;
   a first cell plate line which is connected to said ferro-electric capacitor of said memory cell;
   a cell plate driver which is connected to said first cell plate line;
   a detection unit operable to detect an ambient temperature of said memory cell;
   a switching unit operable to switch and output a voltage depending on the detected ambient temperature; and
   a reference cell which includes a ferro-electric capacitor and which is connected to said memory cell,
   wherein the voltage outputted from said switching unit is inputted to said cell plate driver,
   wherein said cell plate driver is operable to apply the voltage inputted from said switching unit to said first cell plate line,
   whereby a voltage which is applied to said ferro-electric capacitor in said memory cell connected to said first cell plate line is switched according to the detected ambient temperature,
   wherein said switching unit is operable to switch from a first voltage to a second voltage which is higher than the first voltage, in the case where the ambient temperature has decreased to a predetermined temperature, and
   wherein said cell plate driver is further operable to apply the voltage inputted from said switching unit to said second cell plate line.

2. The ferro-electric-memory device according to claim 1, further comprising:
   a control unit operable to control a duration of voltage application so that the second voltage is applied for a shorter length of time than the first voltage, in the case where the second voltage is applied,
   wherein the first voltage and the second voltage are pulse waveforms.

* * * * *